United States Patent [19]
Jaecklin

[11] 4,366,496
[45] Dec. 28, 1982

[54] OPTICALLY ACTIVATABLE SEMICONDUCTOR COMPONENT

[75] Inventor: Andre Jaecklin, Ennetbaden, Switzerland

[73] Assignee: BBC Brown, Boveri & Company Limited, Baden, Switzerland

[21] Appl. No.: 242,289

[22] Filed: Mar. 10, 1981

Related U.S. Application Data

[63] Continuation of Ser. No. 85,410, Oct. 16, 1979, abandoned.

[30] Foreign Application Priority Data

Nov. 24, 1978 [CH] Switzerland .................. 12048/78

[51] Int. Cl.³ ............................................. H01L 29/74
[52] U.S. Cl. .................................. 357/38; 357/20; 357/30
[58] Field of Search ........................... 357/20, 38, 36

[56] References Cited

U.S. PATENT DOCUMENTS

| | | | |
|---|---|---|---|
| 3,943,550 | 3/1976 | Konishi et al. | 357/30 |
| 3,987,476 | 10/1976 | Sittig | 357/38 |
| 4,142,201 | 2/1979 | Sittig et al. | 357/38 |
| 4,186,409 | 1/1980 | McMullin | 357/38 |

FOREIGN PATENT DOCUMENTS 2739182  3/1979  Fed. Rep. of Germany ........ 357/38

Primary Examiner—Joseph E. Clawson, Jr.
Attorney, Agent, or Firm—Oblon, Fisher, Spivak, McClelland & Maier

[57] ABSTRACT

An optically activatable semiconductor component having at least one light-sensitive surface area containing a light-sensitive PN junction which is biased in a nonconducting direction when exposed to light, wherein in order to avoid a reduction in the inhibiting voltage of the optically activatable semiconductor component, the light-sensitive PN junction leading to the light-sensitive surface of the component is shaped such that it has a simple, preferably circular or tubular form at the light-sensitive surface. In one embodiment, plural light-sensitive PN junctions extend to the light-sensitive surface defining several subareas. The technology is applicable to thyristors, diodes, transistors or other light-sensitive semiconductor components.

4 Claims, 4 Drawing Figures

OPTICALLY ACTIVATABLE SEMICONDUCTOR COMPONENT

This is a continuation of application Ser. No. 85,410 filed Oct. 16, 1979, now abandoned.

BACKGROUND OF THE INVENTION

1. Field of the Invention

The invention concerns an optically activatable semiconductor component with at least one light-sensitive surface area containing a PN junction, which is biased in a nonconducting direction when exposed to light. The invention particularly concerns light-ignitable thyristors, which have such a structure.

2. Description of the Prior Art

A light-ignitable thyristor is known for example from German-Austrian [DE-OS] No. 2,408,079. This known component consists of a main thyristor and an integrated auxiliary thyristor for the purpose of ignition amplification. The base zone on the anode side leads up to the surface of the cathode side by means of a narrow channel, such that the PN junction formed by this base zone and the base zone on the cathode side likewise borders directly on the surface of the cathode side. When the surface on the cathode side is irradiated with light, the auxiliary thyristor ignites first, which then causes ignition of the main thyristor.

To keep the light intensity necessary for ignition as low as possible, it has already been suggested that the light-sensitive PN junction exposed at the surface of the component be given a finger-formed structure, and to concentrate the current flowing along this PN junction to individual areas of the P base zone. The N emitter of an auxiliary thyristor is then placed in these areas.

The disadvantage of these structures lies in the fact that this surface geometry entails a considerable reduction in the blocking voltage due to curvature of the PN-junction near the surface (c.f. IEEE ED-22, pp. 910–916, 1975).

SUMMARY OF THE INVENTION

Accordingly, one object of this invention is to provide a novel light activatable semiconductor components of the type initially mentioned in which the reduction in blocking voltage through surface effects can be held to a minimum.

This and other objects are achieved according to the invention by providing an improved optically activatable semiconductor component, and in particular a light-ignitable thyristor, wherein, in order to avoid a reduction in blocking or inhibiting voltage the component is provided a light-sensitive PN junction leading to a light-sensitive surface, with the PN junction shaped in a simple preferable circular or tubular form at the light-sensitive surface. In a particularly advantageous embodiment, the PN junction defines several light-sensitive subareas on the light-sensitive surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
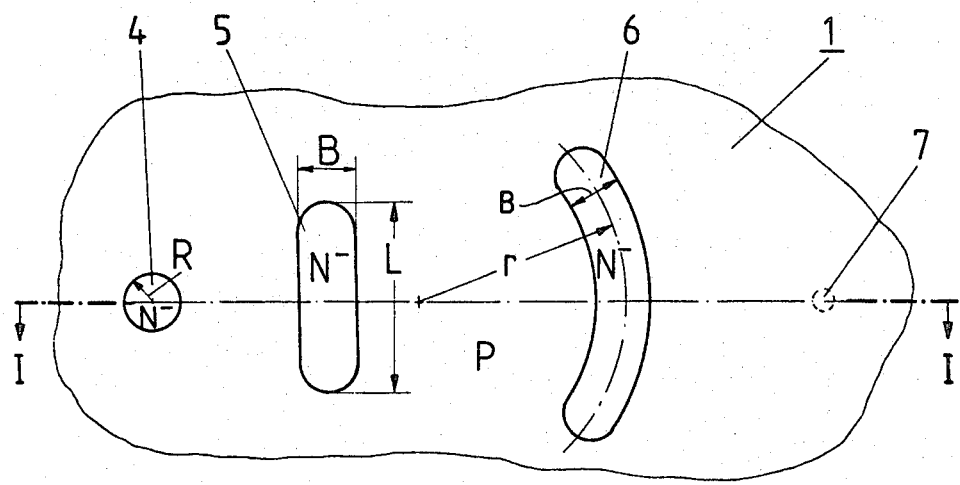
FIG. 1a is a top view of the light-sensitive surface area of a photodiode, wherein the PN junction has various shapes in accordance with the invention.
Figure 1B:
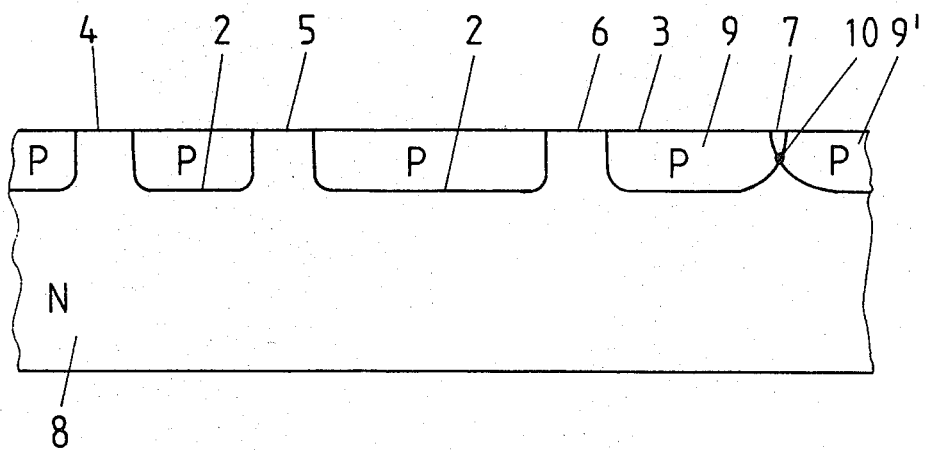
FIG. 1b is a cross-sectional view of the diode shown in FIG. 1a, taken along the line I—I.

Referring now to the drawings, wherein like reference numerals designate identical or corresponding parts throughout the several views, and more particularly to FIGS. 1a and 1b, a photodiode (1) is illustrated with a PN junction (2). The PN junction (2) leads to several locations on the surface (3) of the component and forms there the subareas (4), (5), (6) and (7). The PN junction leading to the surface (3) defines there preferably either a circular curved form, as in area (4), or else a tube shape as in areas (5) and (6). The radius R of the circle or, respectively, the width B of the tube-formed portion of the PN junction (2) is, on the one hand, determined by the depth of the space charge region in the N zone (8) which is derived from the minimum voltage by which the component still should ignite. This depth lies approximately between 5 and 50 μm, depending on the doping of the N zone. On the other hand the radius R or, respectively, the width B can be zero; as FIG. 1b shows for area (7), if the P zones (9) and (9') overlap and the point of intersection (10) lies in the area of the irradiated surface. As the distance of this point of intersection from the surface increases, the strength of the light necessary for ignition must also be continuously increased.

Additionally, as long as the condition $r >> B$ is adhered to for the curved PN junction of area (6), combined structures as illustrated in their basic forms in FIG. 1a are also possible. However, intersections such as those disclosed by Swiss Patent [CH-PS] No. 594,984 have not proven useful for the new components.

In a preferred embodiment the curvature radius r of the tubular-shaped subarea 6 is at least 5 times greater than the width B of the subarea 6.

In another preferred embodiment the ratio of the length L to the width B of the tubular-shaped subarea 5 is less than or equal to 5:1.

Figure 2A:
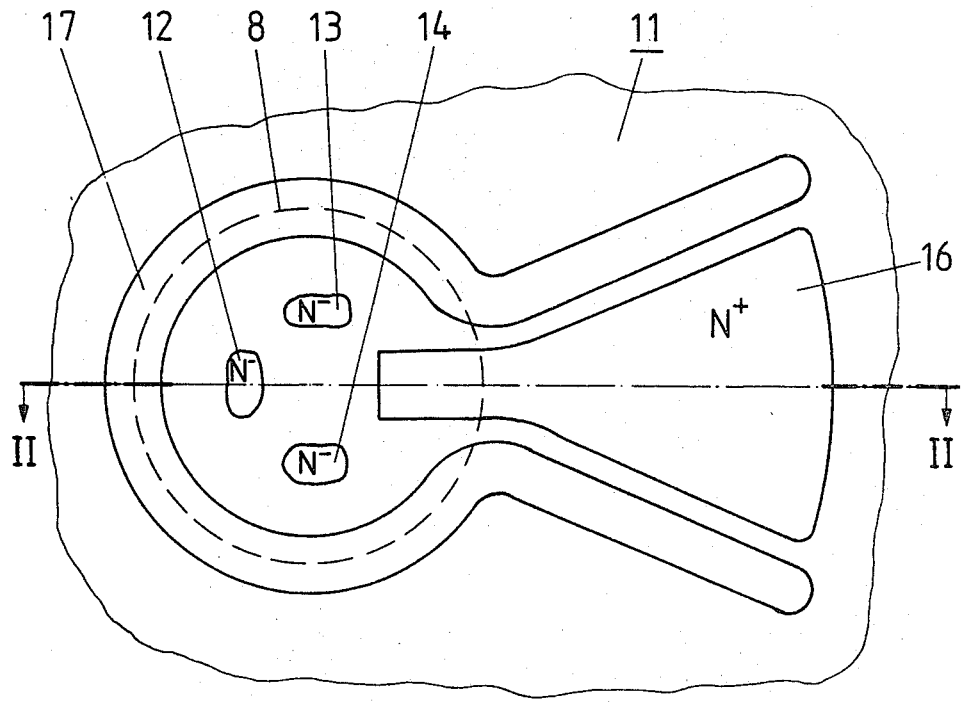
FIG. 2a is a top view of the light-sensitive surface area of a light-ignitable thyristor.
Figure 2B:
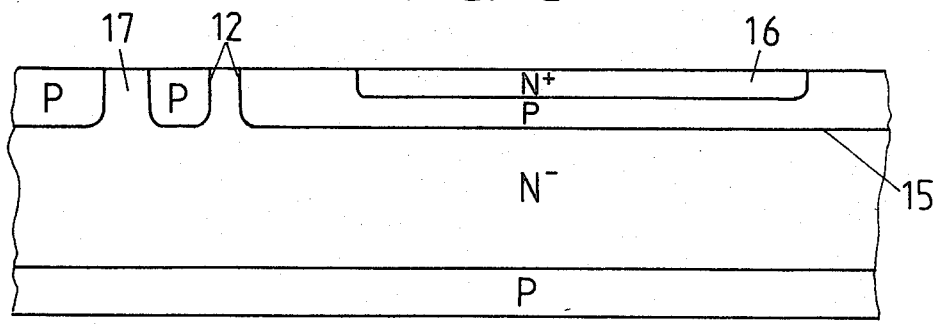
FIG. 2b is a cross-sectional view of the thyristor shown in FIG. 2a, taken along the line II—II.

A variation in design for the ignition area of a light-ignitable thyristor (11) is illustrated in FIGS. 2a and 2b. Numerals (12), (13) and (14) designate the subareas which are formed by the PN junction (15) bordering on the surface on the cathode side. The N+ cathode zone of the auxiliary thyristor is shown by (16). The outer cut (17) fulfills an insulating function (cf. also DE-OS No. 2,408,079). The dotted line (18) delineates the border of the light-sensitive area.

This invention is not limited to diodes and thyristors but can also be utilized for phototransistors, for example.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A light activatable thyristor formed of four zones of alternating conductivity types including a cathode emitter zone, a cathode base zone, an anode base zone and an anode zone, respectively, wherein said cathode and anode zones respectively face cathode side and anode side surfaces, wherein said cathode base zone and said anode base zone define a forward blocking PN-junction therebetween upon application of a biasing voltage from a biasing source, said forward blocking PN-junction emerging on said cathode side surface and being exposed to activating light from a light source, comprising:

said anode base zone penetrating said cathode base zone and emerging to said cathode side surface through said cathode base zone such that said forward blocking junction formed therebetween on said cathode side surface exhibits at least one closed geometric form, and said at least one closed geometric form circumscribing on said cathode side surface only said emerging anode base zone free of any other zone;

said light-sensitive forward blocking PN-junction defining at least one tube having a substantially smooth circumference and characterized by a length L and width B, wherein the ratio of the length L to the width B is less or equal to 5:1.

2. A thyristor according to claim 1 wherein said closed geometric form comprises:

a circle.

3. A thyristor according to claim 1, further comprising:

said at least one tube formed in a curve having a curvature radius r which is at least 5 times greater than the width B of the geometric form.

4. An optically activatable semiconductor component according to claims 1 or 2, further comprising:

at least two of said closed geometric forms.

* * * * *